(12) United States Patent
Trunov et al.

(10) Patent No.: US 12,394,769 B2
(45) Date of Patent: Aug. 19, 2025

(54) BATCH SOLDERING OF DIFFERENT ELEMENTS IN POWER MODULE

(71) Applicant: Infineon Technologies AG, Neubiberg (DE)

(72) Inventors: Kirill Trunov, Warstein (DE); Waltraud Eisenbeil, Großostheim (DE); Frederick Groepper, Paderborn (DE); Joerg Schadewald, Warstein (DE); Arthur Unrau, Geseke (DE); Ulrich Wilke, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/368,914

(22) Filed: Sep. 15, 2023

(65) Prior Publication Data
US 2024/0047439 A1 Feb. 8, 2024

Related U.S. Application Data

(63) Continuation of application No. 16/902,725, filed on Jun. 16, 2020, now Pat. No. 11,798,924.

(51) Int. Cl.
*H01L 25/16* (2023.01)
*B23K 1/19* (2006.01)
(Continued)

(52) U.S. Cl.
CPC .......... *H01L 25/16* (2013.01); *H01L 21/4853* (2013.01); *H01L 23/49811* (2013.01);
(Continued)

(58) Field of Classification Search
CPC ..... H01L 21/4853; H01L 24/32; H01L 24/83; H01L 24/97
See application file for complete search history.

(56) References Cited

U.S. PATENT DOCUMENTS

| 4,843,190 A | 6/1989 | Verhoeven |
| 8,354,692 B2 * | 1/2013 | Otremba ................. H01L 24/73 257/178 |

(Continued)

FOREIGN PATENT DOCUMENTS

| CN | 103094260 A | 5/2013 |
| CN | 105706224 A | 6/2016 |

(Continued)

OTHER PUBLICATIONS

Wang, Y., et al., "Challenges and Trends of High Power IGBT Module Packaging", IEEE Conference and Expo Transportation Electrification Asia-Pacific, Aug. 31, 2014, pp. 1-7.

(Continued)

*Primary Examiner* — Antonio B Crite
(74) *Attorney, Agent, or Firm* — Murphy, Bilak & Homiller, PLLC (57) ABSTRACT

An electronic device includes a substrate including first and second metal regions, a first passive device that includes a metal joining surface and is arranged on the substrate with the metal joining surface of the first passive device facing first metal region, a semiconductor die that includes a metal joining surface and is arranged on the substrate with the metal joining surface of the semiconductor die facing the second metal region, a first soldered joint between the metal joining surface of the first passive device and the first metal region; and a second soldered joint between the metal joining surface of the semiconductor die and the second metal region, wherein a minimum thickness of the first soldered joint is greater than a maximum thickness of the second soldered joint.

19 Claims, 7 Drawing Sheets

(51) Int. Cl.
*H01L 21/48* (2006.01)
*H01L 23/00* (2006.01)
*H01L 23/373* (2006.01)
*H01L 23/488* (2006.01)
*H01L 23/498* (2006.01)
*H01L 23/538* (2006.01)
*H01L 25/07* (2006.01)
*H05K 3/34* (2006.01)
*B23K 1/00* (2006.01)
*H05K 3/12* (2006.01)

(52) U.S. Cl.
CPC .............. *H01L 24/32* (2013.01); *H01L 24/83* (2013.01); *H01L 24/97* (2013.01); *H01L 2224/32227* (2013.01); *H01L 2224/32507* (2013.01); *H01L 2224/8381* (2013.01); *H01L 2224/83815* (2013.01)

(56) References Cited

U.S. PATENT DOCUMENTS

| | | | |
|---|---|---|---|
| 11,798,924 B2* | 10/2023 | Trunov | ............... H05K 3/3463 |
| 2007/0166877 A1 | 7/2007 | Otremba | |
| 2007/0266558 A1* | 11/2007 | Otremba | ........... H01L 23/49575 29/840 |
| 2008/0014460 A1 | 1/2008 | Riedl | |
| 2008/0164488 A1 | 7/2008 | Ikeda et al. | |
| 2009/0236686 A1 | 9/2009 | Shim et al. | |
| 2011/0017803 A1 | 1/2011 | Guth et al. | |
| 2011/0075451 A1* | 3/2011 | Bayerer | ................. H01L 24/85 257/692 |
| 2011/0220704 A1 | 9/2011 | Liu et al. | |
| 2012/0305632 A1 | 12/2012 | Ross et al. | |
| 2013/0009295 A1 | 1/2013 | Otremba | |
| 2013/0049204 A1 | 2/2013 | Oeschler et al. | |
| 2013/0168856 A1 | 7/2013 | Wang et al. | |
| 2013/0200502 A1 | 8/2013 | Nikitin et al. | |
| 2013/0200532 A1 | 8/2013 | Otremba et al. | |
| 2014/0264798 A1* | 9/2014 | Otremba | ................. H01L 24/83 438/112 |
| 2015/0115452 A1 | 4/2015 | Yoon et al. | |
| 2015/0228616 A1 | 8/2015 | Palm et al. | |
| 2015/0279804 A1 | 10/2015 | Raravikar et al. | |
| 2016/0126197 A1 | 5/2016 | Matoy et al. | |
| 2016/0126211 A1 | 5/2016 | Hohlfeld et al. | |
| 2016/0219720 A1 | 7/2016 | Strogies et al. | |
| 2016/0358890 A1* | 12/2016 | Heinrich | ........... H01L 23/49524 |
| 2017/0025223 A1 | 1/2017 | Bultitude et al. | |
| 2017/0207123 A1 | 7/2017 | Mischitz et al. | |
| 2017/0271298 A1 | 9/2017 | Heinrich et al. | |
| 2017/0282287 A1 | 10/2017 | Larsson et al. | |
| 2020/0152587 A1 | 5/2020 | Yu et al. | |

FOREIGN PATENT DOCUMENTS

| | | |
|---|---|---|
| CN | 109534842 A | 3/2019 |
| DE | 10201781 A1 | 8/2003 |
| DE | 102007012689 B3 | 7/2008 |
| DE | 102017004626 A1 | 11/2018 |
| JP | 2008191349 A | 8/2008 |
| KR | 20080008375 A | 1/2008 |
| WO | 2018192987 A1 | 10/2018 |

OTHER PUBLICATIONS

Xingke, Zhao , "Modern Welding and Joining Technologies", ISBN 978-7-5024-7255-9, https://img.duxiu.com/n/jpgfs/book/base/14207415/231013e993f44d83b97887bb43833e33/9a72f796336f17fa040b9b0c3eb93011.shtml?uf=1&t=; English abstract attached, Jun. 1, 2016, 1-7.

Yuhua, Chen , et al., "Advanced Connecting Technologies and Applications", Chapter 10, ISBN 978-7-5165-1985-1, Xian jin Uan jie Ji shu Ji Ying yang, https://img.duxiu.com/n/jpgfs/book/base/14665871/cb7847050dfb4c8aad50eaf3d32ebb8f/2bbd82dcf271ef42a448af46a7e99e72.shtml?uf=1&t=1; English abstract attached, Jul. 1, 2019, 1-6.

Zhang, Qiyan , et al., "Manual of Brazing and soldering", English abstract attached; https://img.duxiu.com/n/jpgfs/book/base/11002932/367c4a7a62924a7aa1c5118a45ad107c/65e415f6147bfa84d2eaf849c8f5e71f.shtml?uf=1&t=1..., Jan. 31, 1999, 1-7.

* cited by examiner

BATCH SOLDERING OF DIFFERENT ELEMENTS IN POWER MODULE

BACKGROUND

Semiconductor power modules are commonplace in a wide variety of applications such as automotive, industrial motor drives, AC-DC power supplies, etc. Semiconductor power modules typically include multiple power semiconductor devices, e.g., power MOSFETs (metal-oxide semiconductor field-effect transistor), IGBTs (insulated gate bipolar transistors), HEMT (high electron mobility transistors), etc., along with other elements such as passive components, bond wires, etc., mounted on a common substrate.

Generally speaking, it is desirable to produce semiconductor power modules using batch processing techniques wherein the various processing steps, e.g., die attach, wire bonding, contact formation, etc., are formed in parallel. In this way, the time and expense associated with producing the module is advantageously reduced. However, the soldering of the various components of the power modules is not well-suited for batch processing. This is because certain soldered joints may require a high tensile strength and low ductility, whereas other soldered joints may require the opposite. Conventional batch soldering techniques are not capable of individual customization of the soldered joints to meet these requirements.

SUMMARY

According to an embodiment of a method of batch soldering, the method comprises providing a first passive device that comprises a metal joining surface, arranging the first passive device on a first metal region of a substrate with a region of first solder material between the metal joining surface of the first passive device and the substrate, providing a semiconductor die that comprises a metal joining surface, arranging the semiconductor die on a second metal region of the substrate with a region of second solder material between the metal joining surface of the semiconductor die and the substrate, and performing a common soldering step that simultaneously forms a first soldered joint from the region of first solder material and forms a second soldered joint from the region of second solder material. The common soldering step is performed at a soldering temperature such that the region of second solder material melts and reacts with the metal joining surface of the semiconductor die and the second metal region of the substrate to form one or more intermetallic phases within the second soldered joint. Each of the one or more intermetallic phases have a melting point above the second solder material and the soldering temperature.

Separately or in combination, the common soldering step is performed without applying mechanical pressure to the first passive device and without applying mechanical pressure to the semiconductor die.

Separately or in combination, a minimum thickness of the first soldered joint is greater than a maximum thickness of the second soldered joint.

Separately or in combination, the first solder material comprises a solder paste with a reflow temperature that is at or below the soldering temperature, the method further comprises stencil printing the solder paste on the first metal region of the substrate, and the arranging of the first passive device comprises placing the first passive device on the stencil-printed solder paste.

Separately or in combination, the second solder material comprises a preformed solder, and the method further comprises applying the preformed solder to the metal joining surface of the semiconductor die or the second metal region of the substrate before the arranging of the semiconductor die on the second metal region of the substrate.

Separately or in combination, a minimum thickness of the stencil-printed solder paste before the common soldering step is equal to or greater than 30 μm, and a maximum thickness of the preformed solder before the common soldering step is equal to or less than 10 μm.

Separately or in combination, the second solder material comprises a liquid solder or a solder paste, a maximum thickness of the second solder material before the common soldering step is greater than the maximum thickness of the second soldered joint, and the thickness of the second solder material reduces during the common soldering step to reach the maximum thickness of the second soldered joint.

Separately or in combination, an intermetallic phase ratio of the second soldered joint is at least 60%.

Separately or in combination, an intermetallic bridge ratio of the second soldered joint is at least 50%.

Separately or in combination, the first passive device is a mechanical connector.

Separately or in combination, the substrate comprises a ceramic layer and a metal layer disposed on the ceramic layer, and wherein the first and second metal regions are physically isolated portions of the metal layer.

Separately or in combination, the first passive device is a discrete electrical component.

Separately or in combination, the semiconductor die comprises a second metal joining surface that faces away from the first metal joining surface, and the method further comprises forming a further region of solder material on the second metal joining surface of the semiconductor die, and forming a third soldered joint between the second metal joining surface and a joining element from the further region of solder material. The common soldering step simultaneously forms the first, second and third soldered joints.

According to an embodiment of an electronic device, the electronic device comprises a substrate comprising first and second metal regions, a first passive device that comprises a metal joining surface and is arranged on the substrate with the metal joining surface of the first passive device facing first metal region, a semiconductor die that comprises a metal joining surface and is arranged on the substrate with the metal joining surface of the semiconductor die facing the second metal region, a first soldered joint between the metal joining surface of the first passive device and the first metal region, and a second soldered joint between the metal joining surface of the semiconductor die and the second metal region. A minimum thickness of the first soldered joint is greater than a maximum thickness of the second soldered joint.

Separately or in combination, the minimum thickness of the first soldered joint is equal to or greater than 30 μm, and the maximum thickness of the second soldered joint is equal to or less than 10 μm.

Separately or in combination, the first soldered joint has a greater ductility than the second soldered joint, and wherein the second soldered joint has a greater tensile strength than the first soldered joint.

Separately or in combination, an intermetallic phase ratio of the second soldered joint is at least 60%, and an intermetallic phase ratio of the first soldered joint is no more than 40%.

Separately or in combination, an intermetallic bridge ratio of the second soldered joint is at least 50%, and an intermetallic bridge ratio of the first soldered joint is no more than 20%.

Separately or in combination, the substrate comprises a ceramic layer and a metal layer disposed on the metal layer, the first and second metal regions are physically isolated portions of the metal layer, and the first passive device is a mechanical connector.

Separately or in combination, the electronic device further comprises a passive electrical element and a third soldered joint electrically connecting the passive electrical element to the metal layer, and the third soldered joint has the same composition and thickness as the first soldered joint or the second soldered joint.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a batch soldering process wherein multiple soldered joints with different characteristics are simultaneously formed by a common soldering step are described herein. According to the technique, a first passive device (e.g., a mechanical connector) is arranged on a first metal region of a substrate with a region of first solder material (e.g., a solder paste) disposed between a metal joining surface of the first passive device and the substrate. Additionally, a semiconductor die (e.g., a power transistor) is arranged on a second metal region of the substrate with a region of second solder material disposed between a metal joining surface of the semiconductor die and the substrate. A common soldering step is performed that simultaneously forms a first soldered joint between the first passive device and the substrate and forms a second soldered joint between the semiconductor die and the substrate. The common soldering step forms the first soldered joint by standard solder reflow and forms the second soldered joint by diffusion soldering. Thus, the second soldered joint includes inter metallic phases having a higher melting point than the soldering temperature. The two different solder reactions are possible in one common soldering step by using a relatively thin, e.g., 10 µm or less, layer for the second solder material and a relatively thick (e.g., 30 µm or greater) layer for the first solder material.

Figure 1:
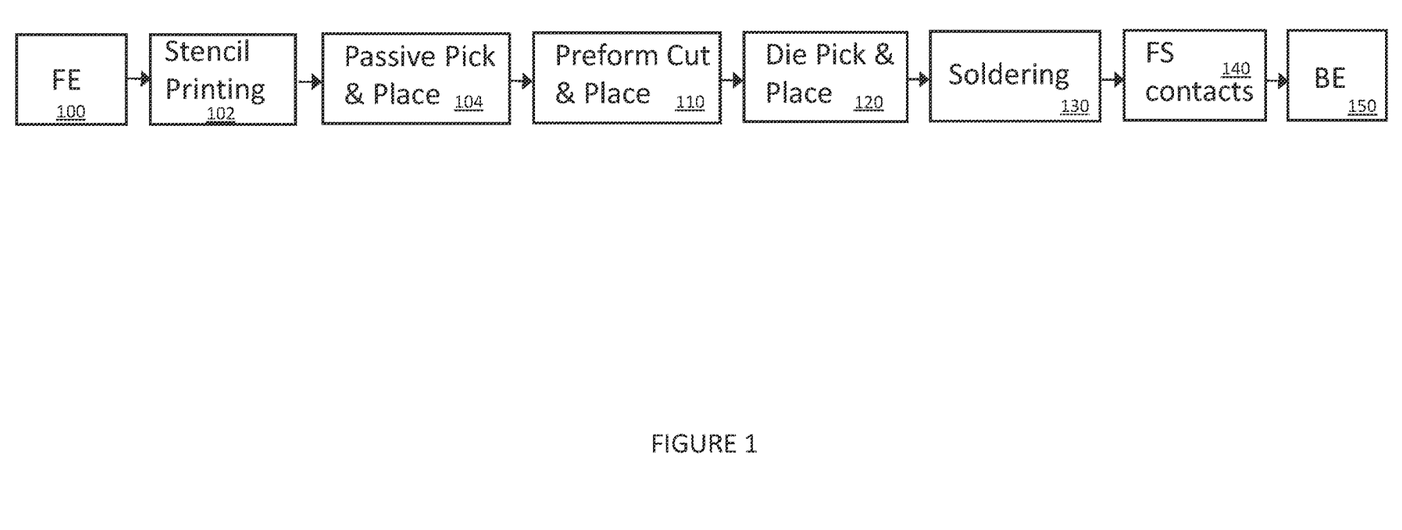
FIG. 1 illustrates a block diagram of a batch soldering method, according to an embodiment.

FIG. 1 illustrates an embodiment of a batch soldering technique. The batch soldering technique includes a front-end (FE) processing step (Block 100), a stencil printing step (Block 102), a passive element pick and place step (Block 104), a solder preform cut & place step (block 110), a die pick and place step (Block 120), a soldering step (Block 130), a front-side contact formation step (Block 140) and a back-end (BE) processing step (Block 150), Unless inconsistent with the embodiments described herein, each of the process steps of FIG. 1 may be performed according to any embodiment of the correspondingly identified processing steps described in U.S. patent application Ser. No. 16/679,408 to Heinrich filed on Nov. 11, 2019, the content of which is incorporated by reference herein in its entirety, and U.S. patent application Ser. No. 16/679,414 to Trunov filed on Nov. 11, 2019, the content of which is incorporated by reference herein in its entirety.

Figure 2A:
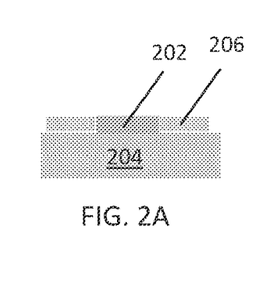
FIGS. 2A through 2F illustrate respective cross-sectional views of an embodiment of blocks 102 through 130 of the method of FIG. 1.

FIG. 2A shows a region of first solder material 202 being formed on a first metal region 204 of a substrate. Generally speaking, the substrate may be any substrate that is used to physically support and/or electrically connect an electronic element, wherein the first metal region 204 is a conductive surface of the substrate. For example, in one embodiment, the substrate is a lead-frame or a metal clip, and the first metal region 204 is a conductive surface of the lead-frame or clip, as the case may be. The lead-frame or metal clip may comprise Cu, Ni and/or Ag, for example. In another embodiment, the substrate includes an electrically insulating layer (e.g., a ceramic layer) and a metal layer attached to the base layer, wherein the first metal region 204 is part of this metal layer. In one embodiment, this metal layer comprises and/or is plated with Cu, Ni, Ag, Au, Pd, Pt, NiV, NiP, NiNiP, NiP/Pd, Ni/Au, NiP/Pd/Au, or NiP/Pd/AuAg. Still other types of metals/metal alloys and substrates may be used.

Generally speaking, the first solder material 202 may be any of a wide variety of commonly known solder materials, including lead-based solders and lead-free solders. In an embodiment, the first solder material 202 is a soft solder paste. For example, the first solder material 202 may include a tin based lead-free solder paste comprising, e.g., Sn/Ag/Cu solder paste, Sn/Ag solder paste, Sn/Ag/Sb solder paste, Sn/Sb solder paste, Sn/Cu solder paste, etc. In one specific example, the first solder material 202 is an Sn/Sb solder paste with a Sb concentration of between 2 and 10 percent, as in, for example, SnSb5 and SnSb8.

The region of first solder material 202 may be formed using a stencil printing technique. According to this technique, a metal stencil 206 (e.g., stainless steel or nickel) is formed to include openings in the desired geometry of the soldered joint. The stencil 206 is placed on the first metal region 204 of the substrate and the opening is tilled with the solder paste using a squeegee, for example. The stencil 206 can then be removed. In other embodiments, the region of first solder material 202 can be formed using a mesh, dispensing or any other suitable method for applying a solder paste.

According to an embodiment, the region of first solder material 202 is formed to have a minimum thickness of 30

µm or greater. This minimum thickness is measured in a vertical direction perpendicular to the surface of the substrate.

Figure 2B:
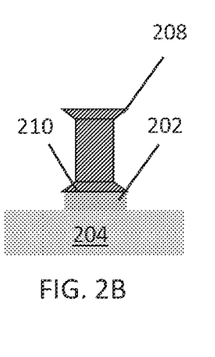

FIG. 2B shows a first passive device 208 arranged over the first metal region 204 of a substrate with the region of first solder material 202 between a metal joining surface 210 of the first passive device 208 and the substrate. In the depicted embodiment, the first passive device 208 is configured as a pin rivet, which is a specific type of mechanical connector with a hollow core that is dimensioned to insertably receive a corresponding protrusion. More generally, the first passive device 208 can include any solderable structure that does not include active electrical circuitry. Examples of these passive devices include mechanical connectors such as pins, rivets, metal plates, etc. Further examples of these passive devices include discrete electrical components such as resistors, capacitors, inductors, diodes, etc. The metal joining surface 210 of the first passive device 208 includes any surface that requires a mechanical connection, an electrical connection, or both. The first passive device 208 can be arranged with the metal joining surface 210 interfacing with the region of first solder material 202 using pick and place machinery, for example.

Figure 2C:
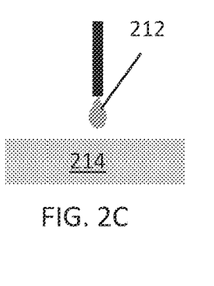

FIG. 2C shows a first liquid 212 being applied to a second metal region 214 of the substrate. In one embodiment, the first liquid 212 is a volatile, non-reactive liquid that provides surface tension for the subsequently deposited preformed solder. The second metal region 214 may be a separate portion of the same metal layer or surface that includes the first metal region 204. For instance, the second metal region 214 and the first metal region 204 may be separate surfaces of the same lead-frame or a metal clip. Alternatively, the second metal region 214 and the first metal region 204 may be parts of the same metal layer that is attached to an electrically insulating base layer. The first and second metal region 214s can be physically isolated from one another (completely separated by an air gap) or may be separate parts of one continuous structure.

Figure 2D:
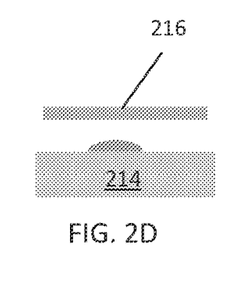

FIG. 2D shows a region of second solder material 216 provided on the second metal region 214 of the substrate with the first liquid 212 disposed between the region of second solder material 216 and the substrate. In the depicted embodiment, the region of second solder material 216 is provided from a preformed solder, i.e., a relatively rigid sheet of solder material that is previously cut in a desired geometry, e.g., square, circle, ring, etc. The solder preform can be stamped or cut from a reel of preform solder material as part of the joining technique, or can be a pre-cut preform, a pre-stamped preform, etc.

According to an embodiment, the region of second solder material 216 is provided using an ultra-thin solder preform. In this context, an "ultra-thin" solder preform refers to a solder preform having a maximum thickness of 15 µm. In various embodiments, the ultra-thin solder preform may have maximum thickness of no greater than 12 µm, 10 µm, 8 µm, 7 µm, or even less. This maximum thickness is measured in a vertical direction perpendicular to the surface of the substrate with the solder preform being flush against the substrate.

Figure 2E:
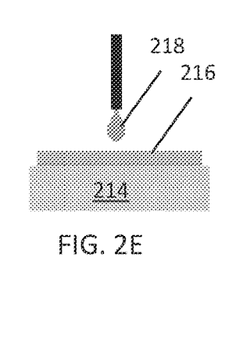

FIG. 2E shows a second liquid 218 being applied to the region of second solder material 216. In one embodiment, the second liquid 218 is a volatile, non-reactive liquid which keeps the semiconductor die 222 in place on the preformed solder by surface tension. The first and second liquids 212, 128 may be the same or different type of liquid.

In an alternate embodiment, the preformed solder is initially provided on the metal joining surface 220 of the semiconductor die 222. In that case, the technique shown in FIGS. 2A-2C is performed on the die site of a semiconductor wafer or on an individual semiconductor die 222 after singulation. Subsequently, the semiconductor die 222 is placed on the second metal region 214 of the substrate with the preformed solder facing the substrate. A liquid may be interposed between the preformed solder and the substrate to increase surface tension.

In another alternate embodiment, the region of second solder material 216 is initially applied as a liquid or paste. This can be done using a stencil printing or other technique. In that case, the initial thickness of the second solder material can be substantially higher e.g., on the order of 30 µm, 20 µm, etc. During the die placement and soldering process to be described below, the thickness of the liquid or paste reduces to reach target values for an effective diffusion soldering process, e.g., no greater than 12 µm, 10 µm, 8 µm, 7 µm, or even less.

Figure 2F:
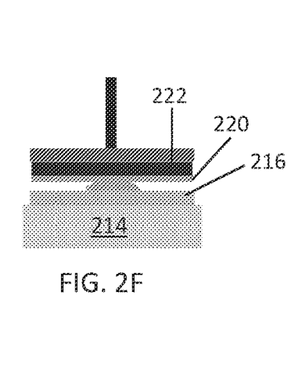

FIG. 2F shows a semiconductor die 222 arranged on the second metal region 214 of the substrate with the region of second solder material 216 between a metal joining surface 220 of the semiconductor die 222 and the substrate. According to an embodiment, the semiconductor die 222 is configured as a power transistor die such as a power MOSFET (metal-oxide semiconductor field-effect transistor), IGBT (insulated gate bipolar transistor), HEAT (high electron mobility transistor), etc. More generally, the semiconductor die 222 can be configured as a logic die such as a gate driver, microcontroller, memory, etc., or a passive die such as an inductor or capacitor die, etc. The metal joining surface 220 of the semiconductor die 222 may be a conductive bond pad which forms a terminal such as a load terminal, control terminal, I/O terminal, etc. The metal joining surface 220 of the semiconductor die 222 may include Cu, Ni, Ag, Au, Pd, Pt, NiV, NiP, NiNiP, NiP/Pd, Ni/Au, NiP/Pd/Au, NiP/Pd/AuAg, NiV/Ag, NiV/Au, or NiSi/Ag, etc.

Generally speaking, the second solder material 216 may include any solder material that is suitable for a diffusion soldering technique, i.e., a soldering technique which produces intermetallic phases in the soldered joint with a higher melting point than the soldering temperature. The second solder material may have a lower melting point than the metal joining surface 220 of the semiconductor die 222 and the second metal region 214 of the substrate. In one embodiment, the second solder material 216 comprises Sn, Zn, In, Ga, Bi, Cd or any alloy thereof. For example, the second solder material 216 may comprise Sn/Ag/Cu, Sn/Ag, Sn/Ag/Sb, Sn/Sb, Sn/Cu or Au80/Sn20.

Once the first passive device 208 and the semiconductor die 222 are arranged on the substrate with the regions of first and second solder material 202, 216 respectively separating these elements from the substrate, a common soldering step is performed. The common soldering step simultaneously forms a first soldered joint 224 (referenced in FIG. 3) from the region of first solder material 202 and forms a second soldered joint 226 (referenced in FIG. 3) from the region of second solder material 216. That is, through a single application of heat to the assembly, the necessary reactions occur in both regions of solder material 202, 216 to form the first and second soldered joints 224, 226.

The common soldering step is performed at a soldering temperature that is at or above a reflow temperature of the first solder material 202. As a result, the first solder material 202 melts and forms metallurgical bonds with the metal joining surface 210 of the first passive device 208 and the first metal region 204 of the substrate in a commonly known manner.

Additionally, the common soldering step is performed at a soldering temperature such that the region of second solder material 216 melts and reacts with the metal joining surface 220 of the semiconductor die 222 and the second metal region 214 of the substrate to form one or more intermetallic phases within the second soldered joint 226, with each of the one or more intermetallic phases having a melting point above the second solder material 216 and the soldering temperature.

The metal joining surface 220 of the semiconductor die 222 and the second metal region 214 of the substrate may comprise the same or different metal/metal alloy. If the metal regions joined by the second soldered joint 226 comprise the same metal or metal alloy as the second solder material 216, a single intermetallic phase is formed throughout the entire second soldered joint 226. For example, if the metal joining surface 220 of the semiconductor die 222 and the second metal region 214 of the substrate both comprise Cu or the same Cu-rich alloy, Cu will dissolve via the liquified second solder material during the diffusion soldering process until a certain concentration is reached, at which point the joint solidifies. The resulting Cu-based intermetallic phase will not melt again at the solder temperature of the diffusion soldering process. The same applies for other types of common die and substrate metallization such as Ni-rich and Ag-rich alloys, for example.

If the metal joining surface 220 of the semiconductor die 222 and the second metal region 214 of the substrate comprise a different metal/metal alloy, a plurality of intermetallic phases are formed throughout the entire soldered joint. In either case, the second solder material 216 may mostly or completely react with the metal joining surface 220 of the semiconductor die 222 and the second metal region 214 of the substrate during the common soldering step such that the second soldered joint 226 has a high melting phase throughout the entire second soldered joint 226.

The above described process advantageously simultaneously forms the first soldered joint 224 by standard soldering and forms the second soldered joint 226 by diffusion soldering. In a typical diffusion soldering process, mechanical pressure is used to effectuate the soldering. For example, a movable press is typically used to apply mechanical pressure to the soldered elements. However, the common soldering step described herein is performed without applying mechanical pressure, e.g., using a movable press, to any of the soldered elements. This is made possible through the usage of ultra-thin solder for the second solder material 216. By maintaining the thickness of the second solder material below a certain value, e.g., below 10 μm, the soldering temperature of the common soldering step may be set so that the solder preform melts and reacts to form the necessary intermetallic phases in the above described manner. Additionally, the soldering temperature of the common soldering step is sufficient to reflow the first solder material, thereby enabling the formation of two soldered joints without mechanical pressure.

Generally speaking, the soldering conditions (e.g., time and temperature) of the common soldering step can be selected to cause substantial reflow of the first solder material 202 and to cause an intermetallic phase ratio of at least 50% in the second solder material 216. In an embodiment, this intermetallic phase ratio can be obtained by performing the common soldering step at a temperature of between about 275° C. and 325° C. for a duration of not greater than about 180 seconds.

While FIGS. 2A through 2F show one passive device 208 joined to a first metal region 204 of a substrate and one semiconductor die 222 joined to a second metal region 214 of a substrate, the technique can be a batch process wherein multiple passive devices and/or multiple semiconductor dies are soldered at the same time to the same substrate, joined to individual substrates, or joined in respective groups to separate substrates. Moreover, the sequence of steps is not limited to the specific order shown in FIGS. 2A through 2F. More generally, any order of steps which arranges the first passive device 208 and the semiconductor die 222 on the substrate with the regions of first and second solder material 202, 216 respectively separating these elements from the substrate prior to the common soldering process may be performed. For example, placement of the first passive device 208 on the region of first solder material 202 may occur after placement of the semiconductor die 222 on the region of second solder material 216.

Figure 3:
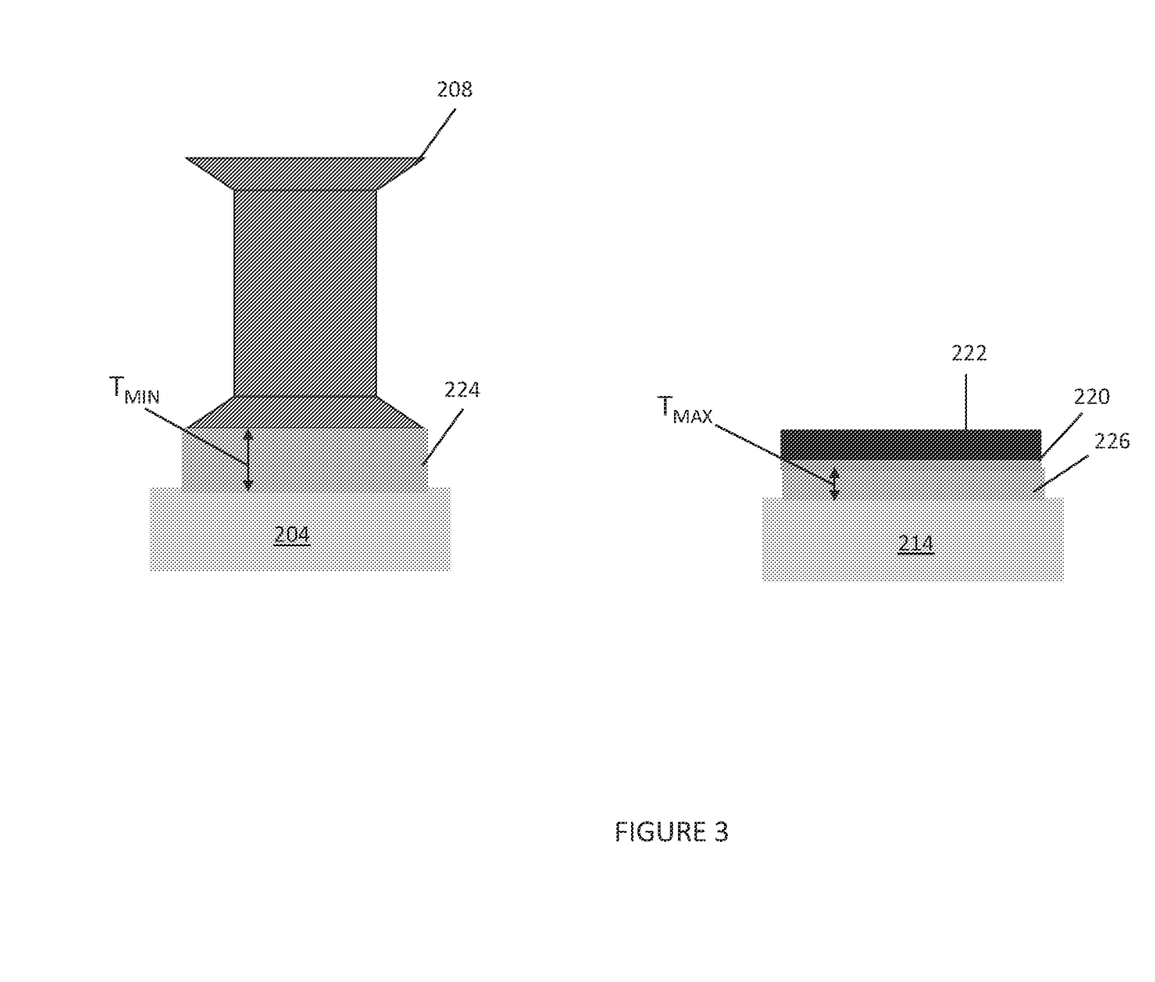
FIG. 3 illustrates a first soldered joint formed between a first passive device and a first metal region and a second soldered joint formed between a semiconductor die and a second metal region, according to an embodiment.

FIG. 3 shows close-up views of the first and second soldered joints 224, 226 that respectively join the first passive device 208 with the first metal region 204 and join the semiconductor die 222 with the second metal region 214. The first and soldered joints 224, 226 have different physical attributes.

A first difference in physical attributes between the first and soldered joints is the thickness of these soldered joints. Specifically, a minimum thickness ($T_{MIN}$) of the first soldered joint 224 is greater than a maximum thickness ($T_{MAX}$) of the second soldered joint 226. For example, the first soldered joint 224 may have a minimum thickness ($T_{MIN}$) of about 50 μm, about 40 μm, about 30 μm, etc. and the second soldered joint 226 may have a maximum thickness ($T_{MAX}$) of about 10 μm, 8 μm, 7 μm, etc. The thicknesses of the first and second soldered joints 224, 226 are correlated to the initial thicknesses of the first and second solder materials 202, 216 before the common soldering step, but may be less than these initial values due to the melting and resulting lateral spreading of the solder material during the common soldering step.

A second difference in physical attributes between the first and soldered joints 224, 226 is the amount of intermetallic phases in these soldered joints. An intermetallic phase is a chemical compound consisting of two different metals and having different crystallographic structures than the elements they are composed of. For example, in the case of an Sn based solder material that is provided between Cu based metal surfaces, the first and soldered joints 224, 226 may include intermetallic phases of CuSn with different crystallographic properties and a higher melting point than alloyed CuSn or metallic Cu and metallic Sn.

According to an embodiment, the second soldered joint 226 has a higher intermetallic phase ratio than the intermetallic phase ratio of the first soldered joint 224. For example, the intermetallic phase ratio of the second soldered joint 226 may be at least 50%, at least 60%, at least 70%, etc. The intermetallic phase ratio of the first soldered joint 224 may be no greater than 40%, no greater than 20%, no greater than 10%, etc. The intermetallic phase ratio is measured along a cross-sectional thickness of the soldered joint that extends perpendicular to the joined surfaces, such as the cross-sectional thickness shown in FIG. 3. The intermetallic phase ratio is a ratio between the area of the intermetallic phases present within the soldered joint along the cross-sectional thickness and the area of non-intermetallic phase containing solder material along the cross-sectional thickness.

According to an embodiment, the intermetallic bridge ratio of the second soldered joint 226 is higher than the intermetallic bridge ratio of the first soldered join 224. For example, the intermetallic bridge ratio of the second soldered joint 226 may be at least 50%, at least 60%, at least 70%, etc. The intermetallic bridge ratio of the first soldered joint 224 may be no greater than 40%, no greater than 20%, no greater than 10%, etc. The intermetallic bridge ratio is measured along a single line that is within the soldered joint and is perpendicular to the thickness direction of the soldered joint, i.e., parallel to the joined metal surfaces. The intermetallic bridge ratio is a ratio between the length of the single line which extends through intermetallic phases and the length of the single line which extends through non-intermetallic phase containing solder material.

Generally speaking, there is a trade-off between ductility and tensile strength in the formation of soldered joints. That is, a soldered joint which is formed with high ductility will have low tensile strength and vice-versa. The differences in physical characteristics between the first and second soldered joints 224, 226 produces a ductility and tensile strength that is preferable for each soldered joint. Specifically, the first soldered joint 224 has a relatively high ductility and low tensile strength, due to its material composition and low intermetallic phase ratio. This high ductility is particularly desirable for soldered joints that withstand substantial mechanical stress, e.g., a pin-rivet that is used to anchor a press-fit connector of a power module. Meanwhile, the second soldered joint 226 has a relatively low ductility and high tensile strength, due to its material composition and low intermetallic phase ratio. This high tensile strength is particularly advantageous for soldered joints that undergo substantial thermal loading during operation of the device. An example such a soldered joint is a load terminal connection (e.g., source, drain, etc.) for a power semiconductor die 222, which experiences substantial heating during operation.

Through appropriate tailoring of various soldering parameters, the ductility and tensile strength of the first and second soldered joints 224, 226 can be customized to meet a certain application requirement. Examples of these parameters include thickness of the first solder material 202, composition of the first solder material 202, thickness of the second solder material 216, composition of the second solder material 216, time of the common soldering step, temperature of the common soldering step, etc.

Figure 4:
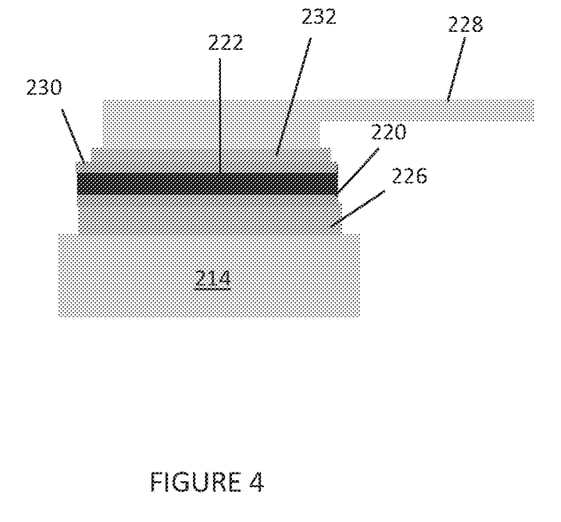
FIG. 4 illustrates a semiconductor die with two soldered joints formed on opposite sides of the die, according to an embodiment.

Referring to FIG. 4, an alternate embodiment is shown wherein an additional joining element 228 is soldered to an upper side of the semiconductor die 222 by the common soldering step that forms the first and second soldered joints 224, 226. The semiconductor die 222 includes a second metal joining surface 230 that faces away from the first metal joining surface 220. The second metal joining surface 230 of the semiconductor die 222 may be a conductive bond pad which forms a terminal of the die such as a load terminal, control terminal, I/O terminal, etc. After arranging the semiconductor die 222 on the second metal region 214 of the substrate, a further solder material is applied to the exposed upper side of the semiconductor die 222 which comprises the second metal joining surface 230. The further solder material may include a solder paste which has the same compositions and/or thicknesses as the first solder material 202 described herein. Alternatively, the further solder material may include a preformed solder with the same composition and/or thicknesses as the second solder material 216 described herein. In yet another embodiment, the further solder material is different from the first and second solder materials 202, 216 but has a reflow temperature that is below the soldering temperature of the common soldering step. In any of these examples, the common soldering step forms a third soldered joint 232 between the second metal joining surface 220 and the joining element 228. As shown, the joining element 228 is configured as a metal interconnect clip. More generally, the joining partner can be any conductive structure, e.g., bond wire, ribbon, heat sink, etc.

Figure 5:
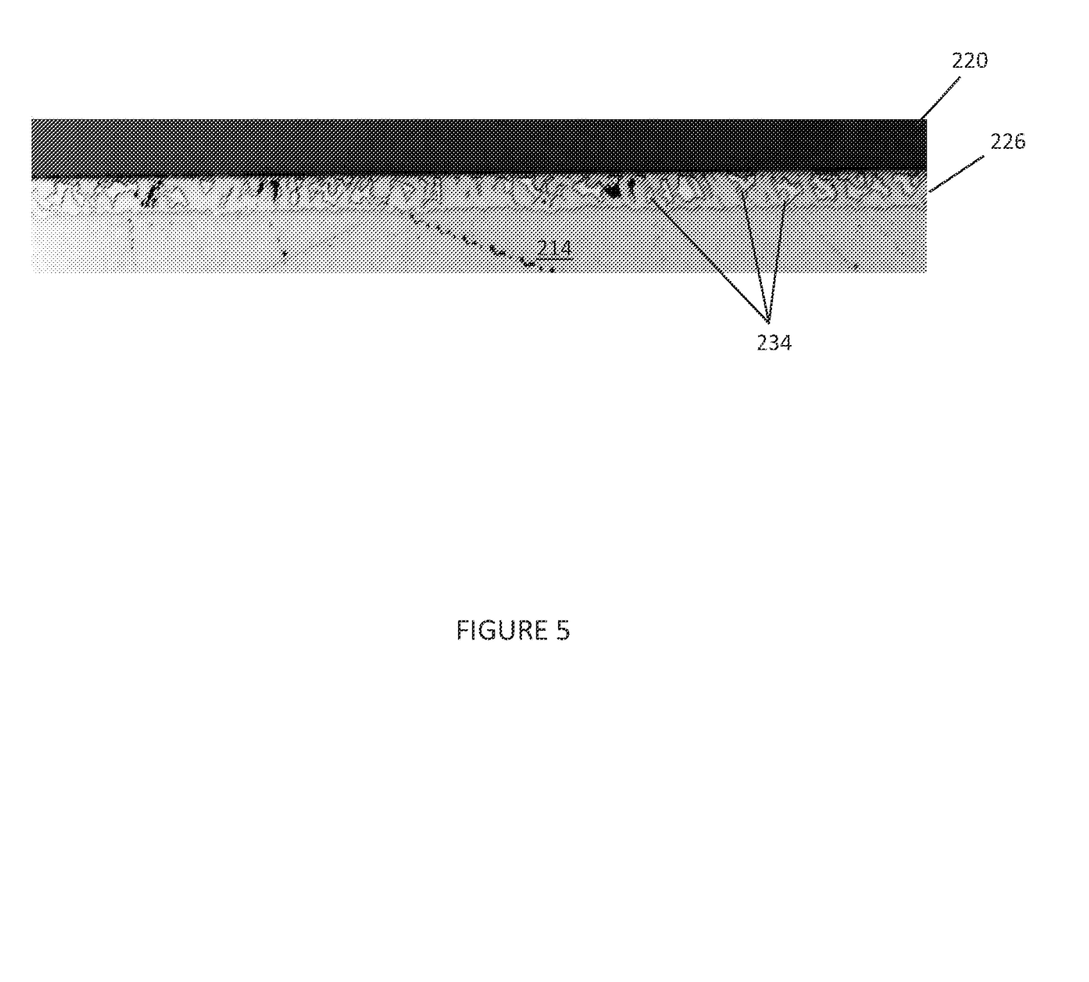
FIG. 5 illustrates the intermetallic phases present in a soldered joint formed by a diffusion soldering process according to the method of FIG. 1, according to an embodiment.

Referring to FIG. 5, a cross-sectional view of a second soldered joint 226 that can be formed according to the above described techniques is depicted, according to an embodiment. As can be seen, the second soldered joint 226 includes a high density of intermetallic phases 234, and thus has a high intermetallic phase ratio. As shown, the intermetallic phase ratio is about 60%. Moreover, the intermetallic phases 234 form substantially throughout the entire thickness of the second soldered joint 226. Thus, the second soldered joint 226 has advantageous tensile strength and does not melt when the semiconductor die 222 is operating at high temperatures.

Figure 6:
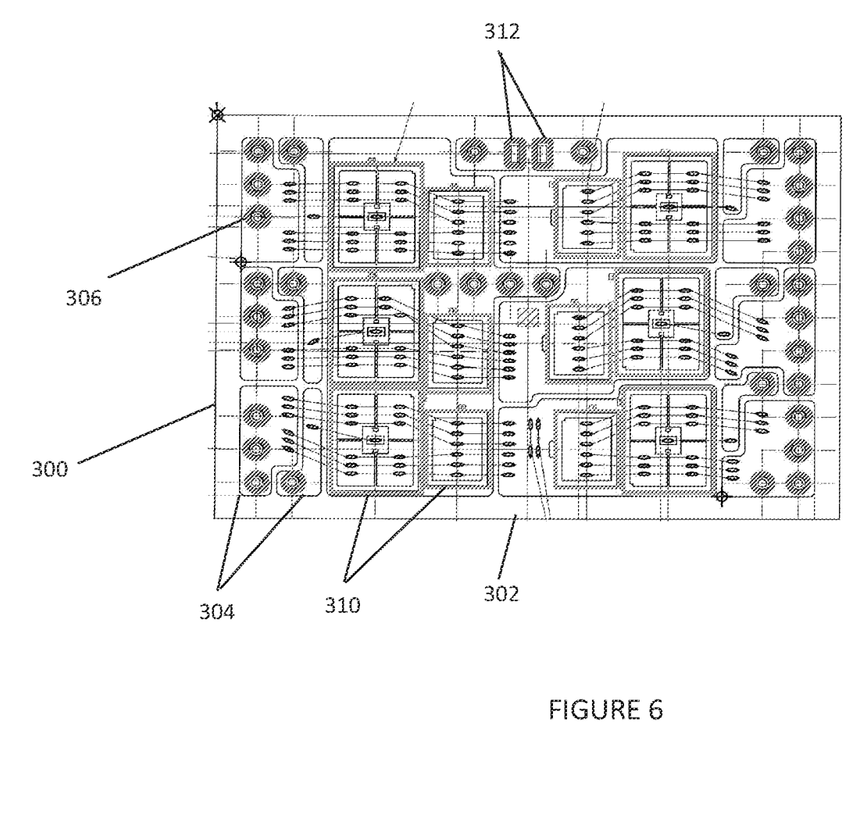
FIG. 6 illustrates soldering locations for mechanical connectors and semiconductor dies on a substrate for a power semiconductor module, according to an embodiment.

Referring to FIG. 6, an example of the batch soldering technique that is used to solder different elements to a DBC substrate 300 of a power semiconductor module is depicted, according to an embodiment. The DBC substrate 300 includes a layer of ceramic 302 formed underneath a first metallization layer. The first metallization layer is structured to include a plurality of discrete and physically isolated bond pads 304. Some of these bond pads 304 provide locations 306 for first passive elements. Some of these bond pads 304 provide locations 310 for semiconductor dies. The group of semiconductor dies includes six power transistor dies along with six corresponding gate driver dies. The batch soldering method described herein can be used to form the regions of first solder material 202 in the locations 306 for first passive elements and the regions of second solder material 216 in the locations 310 for semiconductor dies. After formation of the solder material and placement of the elements, the common soldering step can be performed to form the first soldered joints 224 for the passive elements and the second soldered joints 226 for the semiconductor dies. Thus, in comparison to a technique wherein the solder connections for the passive elements and the active elements are formed separately, the technique described herein provides for highly efficient processing with minimal expense. Moreover, the technique can be integrated into a standard assembly line using standard equipment. After forming the soldered joints, bond wires can be formed on the assembly to complete the necessary electrical connections between the semiconductor dies and the bond pads 304 which include the first passive elements.

Optionally, the batch soldering technique may be used to form third soldered joints between another passive electrical element and the metal layer. The passive electrical element may be a discrete capacitor, for example. The locations 312 for the further passive electrical element may be on the same or different bond pad 304 as the first passive elements. The batch soldering method described herein is used to apply a further solder material in the depicted locations 312 for the further passive electrical element. The further solder material can be formed according to either one of the techniques used to form the first region of solder material 202 or the second region of solder material 216. Alternatively, a further solder material with a different thickness and/or composition may be used, provided that the further solder material reflows at the soldering temperature of the common soldering step. The third soldered joint can be formed at the same time as the first and second soldered joints 224, 226 during the common soldering step. In an embodiment, the third soldered joint has the same composition and thickness as the first soldered joint 224 or the second soldered joint 226, This configuration may be obtained by forming the further solder material with the same composition and thickness as the first region of solder material 202 used for the first soldered joint 224 or the second region of solder material 216 used for the second soldered joint 226, as the case may be.

Figure 7:
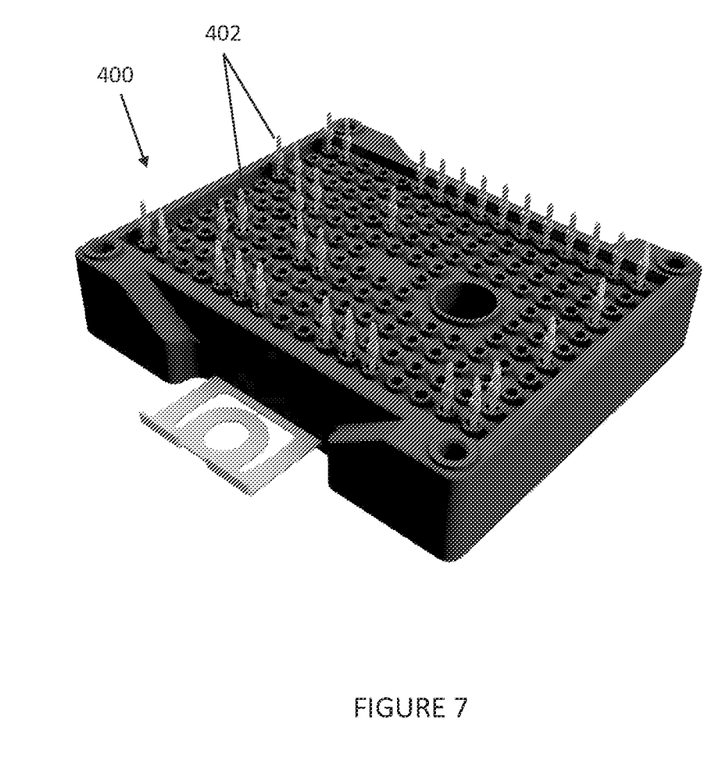
FIG. 7 illustrates a power semiconductor module, according to an embodiment.

Referring to FIG. 7, a completed power semiconductor module 400 is shown. The power semiconductor module 400 includes a protective housing with a plurality of press-fit connectors 402 protruding out from the housing. The press-fit connectors 402 are mechanically and electrically connected to pin rivets, which in turn are soldered to the bond pads of a DOB substrate. Due to the soldering techniques described herein, this connection can be formed with a high ductility, which allows for significant stress to be placed on the press-fit connectors 402. Meanwhile, the soldering techniques described herein provide a high tensile strength solder connection between the semiconductor dies and the bond pads within the power semiconductor module 400, which provides high reliability robustness.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device, comprising:
a substrate comprising first and second metal regions;
a first passive device that comprises a metal joining surface and is arranged on the substrate with the metal joining surface of the first passive device facing first metal region;
a semiconductor die that comprises a metal joining surface and is arranged on the substrate with the metal joining surface of the semiconductor die facing the second metal region;
a first soldered joint between the metal joining surface of the first passive device and the first metal region; and
a second soldered joint between the metal joining surface of the semiconductor die and the second metal region,
wherein a minimum thickness of the first soldered joint is greater than a maximum thickness of the second soldered joint, and
wherein the substrate comprises a ceramic layer and a metal layer disposed on the ceramic layer, wherein the first and second metal regions are physically isolated portions of the metal layer, and wherein the first passive device is a mechanical connector that is physically isolated from the semiconductor die, wherein the mechanical connector is one of a pin or a rivet.

2. The electronic device of claim 1, wherein the minimum thickness of the first soldered joint is equal to or greater than 30 µm, and wherein the maximum thickness of the second soldered joint is equal to or less than 10 µm.

3. The electronic device of claim 1, wherein the first soldered joint has a greater ductility than the second soldered joint, and wherein the second soldered joint has a greater tensile strength than the first soldered joint.

4. The electronic device of claim 1, wherein an intermetallic phase ratio of the second soldered joint is at least 60%, and wherein an intermetallic phase ratio of the first soldered joint is no more than 40%.

5. The electronic device of claim 1, wherein an intermetallic bridge ratio of the second soldered joint is at least 50%, and wherein an intermetallic bridge ratio of the first soldered joint is no more than 20%.

6. The electronic device of claim 1, further comprising a passive electrical element and a third soldered joint electrically connecting the passive electrical element to the metal layer, wherein the third soldered joint has the same composition and thickness as the first soldered joint or the second soldered joint.

7. An electronic device, comprising:
a substrate comprising first and second metal regions;
a first passive device that comprises a metal joining surface and is arranged on the substrate with the metal joining surface of the first passive device facing first metal region;
a semiconductor die that comprises a metal joining surface and is arranged on the substrate with the metal joining surface of the semiconductor die facing the second metal region;
a first soldered joint between the metal joining surface of the first passive device and the first metal region; and
a second soldered joint between the metal joining surface of the semiconductor die and the second metal region,
wherein a minimum thickness of the first soldered joint is greater than a maximum thickness of the second soldered joint, and
wherein the first passive device is attached to the substrate solely by the first soldered joint,
wherein the minimum thickness of the first soldered joint is equal to or greater than 30 µm, and wherein the maximum thickness of the second soldered joint is equal to or less than 10 µm.

8. The electronic device of claim 7, wherein the first soldered joint has a greater ductility than the second soldered joint, and wherein the second soldered joint has a greater tensile strength than the first soldered joint.

9. The electronic device of claim 7, wherein an intermetallic phase ratio of the second soldered joint is at least 60%, and wherein an intermetallic phase ratio of the first soldered joint is no more than 40%.

10. The electronic device of claim 7, wherein an intermetallic bridge ratio of the second soldered joint is at least 50%, and wherein an intermetallic bridge ratio of the first soldered joint is no more than 20%.

11. The electronic device of claim 7, wherein the substrate comprises a ceramic layer and a metal layer disposed on the ceramic layer, wherein the first and second metal regions are physically isolated portions of the metal layer, and wherein the first passive device is a mechanical connector.

12. The electronic device of claim 11, further comprising a passive electrical element and a third soldered joint electrically connecting the passive electrical element to the metal layer, wherein the third soldered joint has the same composition and thickness as the first soldered joint or the second soldered joint.

13. An electronic device, comprising:
a substrate comprising first and second metal regions that are separate parts of a continuous structure;
a first passive device that comprises a metal joining surface and is arranged on the substrate with the metal joining surface of the first passive device facing first metal region;
a semiconductor die that comprises a metal joining surface and is arranged on the substrate with the metal joining surface of the semiconductor die facing the second metal region;
a first soldered joint between the metal joining surface of the first passive device and the first metal region; and
a second soldered joint between the metal joining surface of the semiconductor die and the second metal region,
wherein a minimum thickness of the first soldered joint is greater than a maximum thickness of the second soldered joint.

14. The electronic device of claim 13, wherein the minimum thickness of the first soldered joint is equal to or greater than 30 μm, and wherein the maximum thickness of the second soldered joint is equal to or less than 10 μm.

15. The electronic device of claim 13, wherein the first soldered joint has a greater ductility than the second soldered joint, and wherein the second soldered joint has a greater tensile strength than the first soldered joint.

16. The electronic device of claim 13, wherein an intermetallic phase ratio of the second soldered joint is at least 60%, and wherein an intermetallic phase ratio of the first soldered joint is no more than 40%.

17. The electronic device of claim 13, wherein an intermetallic bridge ratio of the second soldered joint is at least 50%, and wherein an intermetallic bridge ratio of the first soldered joint is no more than 20%.

18. The electronic device of claim 13, wherein the substrate comprises a ceramic layer and a metal layer disposed on the ceramic layer, and wherein the first passive device is a mechanical connector.

19. The electronic device of claim 18, further comprising a passive electrical element and a third soldered joint electrically connecting the passive electrical element to the metal layer, wherein the third soldered joint has the same composition and thickness as the first soldered joint or the second soldered joint.

* * * * *